(12) United States Patent
Frougier et al.

(10) Patent No.: US 12,363,977 B2
(45) Date of Patent: Jul. 15, 2025

(54) FORMING DIELECTRIC SIDEWALL AND BOTTOM DIELECTRIC ISOLATION IN FORK-FET DEVICES

(71) Applicant: International Business Machines Corporation, Armonk, NY (US)

(72) Inventors: Julien Frougier, Albany, NY (US); Ruilong Xie, Niskayuna, NY (US); Kangguo Cheng, Schenectady, NY (US); Dimitri Houssameddine, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 829 days.

(21) Appl. No.: 17/463,019

(22) Filed: Aug. 31, 2021

(65) Prior Publication Data
US 2023/0066979 A1 Mar. 2, 2023

(51) Int. Cl.
*H10D 64/01* (2025.01)
*H01L 21/311* (2006.01)
(Continued)

(52) U.S. Cl.
CPC ..... *H10D 64/018* (2025.01); *H01L 21/31144* (2013.01); *H01L 21/76832* (2013.01);
(Continued)

(58) Field of Classification Search
CPC ............. H01L 29/66553; H01L 29/785; H01L 29/66795; H01L 29/0673; H01L 29/66439;
(Continued)

(56) References Cited

U.S. PATENT DOCUMENTS 9,397,200 B2   7/2016  Qi
9,614,056 B2   4/2017  Xie
(Continued)

FOREIGN PATENT DOCUMENTS

EP            3961688        3/2022
WO      WO 2021075434        4/2021

OTHER PUBLICATIONS

J. Zhang et al., "Full Bottom Dielectric Isolation to Enable Stacked Nanosheet Transistor for Low Power and High Performance Applications." International Electron Devices Meeting (IEDM), 2019, 11.6, 4 pp.
(Continued)

*Primary Examiner* — Tuan A Hoang
(74) *Attorney, Agent, or Firm* — Samuel Waldbaum; Otterstedt & Kammer PLLC

(57) ABSTRACT

A semiconductor apparatus includes a substrate; a central vertical pillar of dielectric material protruding upward from the substrate; a left plurality of semiconductor fins protruding horizontally from a left side of the central vertical pillar above the substrate; a right plurality of semiconductor fins protruding horizontally from a right side of the central vertical pillar opposite the left plurality of semiconductor fins; a gate stack surrounding the central vertical pillar and the left and right pluralities of semiconductor fins; and a bottom dielectric insulating layer protruding horizontally left and right of the central vertical pillar below the left and right pluralities of fins and adjacent to the substrate.

20 Claims, 15 Drawing Sheets

(51) Int. Cl.
  *H01L 21/768*  (2006.01)
  *H10D 30/01*  (2025.01)
  *H10D 30/62*  (2025.01)
  *H10D 62/10*  (2025.01)
  *H10D 84/01*  (2025.01)
  *H10D 84/03*  (2025.01)
  *H10D 84/83*  (2025.01)

(52) U.S. Cl.
  CPC ........... *H10D 30/024* (2025.01); *H10D 30/62* (2025.01); *H10D 62/115* (2025.01); *H10D 62/119* (2025.01); *H10D 64/015* (2025.01); *H10D 84/0158* (2025.01); *H10D 84/038* (2025.01); *H10D 84/834* (2025.01)

(58) Field of Classification Search
  CPC ........... H01L 29/775; H01L 21/823481; H01L 21/823878; H01L 21/823431
  See application file for complete search history.

(56) References Cited

U.S. PATENT DOCUMENTS

| | | |
|---|---|---|
| 9,960,077 B1 | 5/2018 | Zang |
| 10,103,238 B1 | 10/2018 | Zang |
| 10,177,037 B2 | 1/2019 | Zang |
| 10,510,620 B1 | 12/2019 | Chanemougame |
| 10,665,669 B1 | 5/2020 | Xie |
| 10,840,329 B1 | 11/2020 | Xie |
| 2020/0105869 A1 | 4/2020 | Loubet |
| 2020/0152734 A1 | 5/2020 | Frougier |
| 2021/0175130 A1* | 6/2021 | Chan ................... H10D 62/121 |
| 2021/0305412 A1* | 9/2021 | Chan ................... H10D 84/038 |
| 2022/0068725 A1* | 3/2022 | Chan ................ H01L 21/76283 |
| 2022/0246644 A1 | 8/2022 | Nakaoka |

OTHER PUBLICATIONS

P. Weckx et al., "Novel forksheet device architecture as ultimate logic scaling device towards 2nm," International Electron Devices Meeting (IEDM), 2019, 36.5, 4 pp.

Mertens H. et al: "Forksheet FETs for Advanced CMOS Scaling: Forksheet-Nanosheet Co-Integration and Dual Work Function Metal Gates at 17run N-P Space", 2021 Symposium on VLSI Technology, Japan Society of Applied Physics (JSAP), Jun. 13, 2021 (Jun. 13, 2021), pp. 1-2.

Flexible Single Diffusion Break Patterning for Fork Sheet Device for AI Circuit Application ED—Darl Kuhn, ip.com, ip.com Inc., West Henrietta, NY, US, May 28, 2020 (May 28, 2020).

Rosner, Yvonne, European Patent Office, PCT/EP2022/072464, Provisional Opinion Accompanying the Partial Search Result on Nov. 18, 2022 pp. 13.

Seek, Martin, European Patent Office, PCT/EP2022/072464, International Search Report & Written Opinion of the International Searching Authority on Jan. 10, 2023. pp. 21.

* cited by examiner

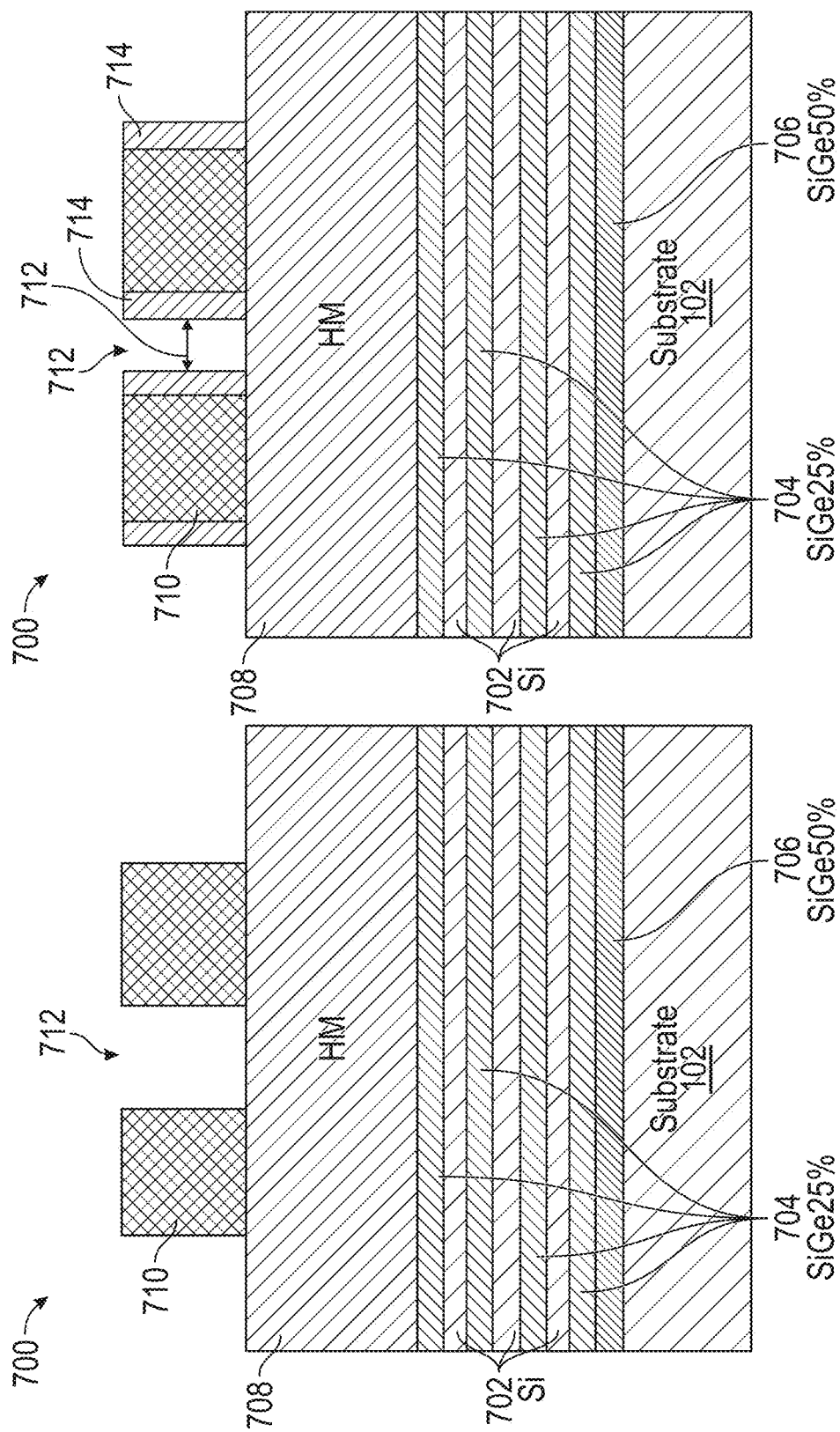

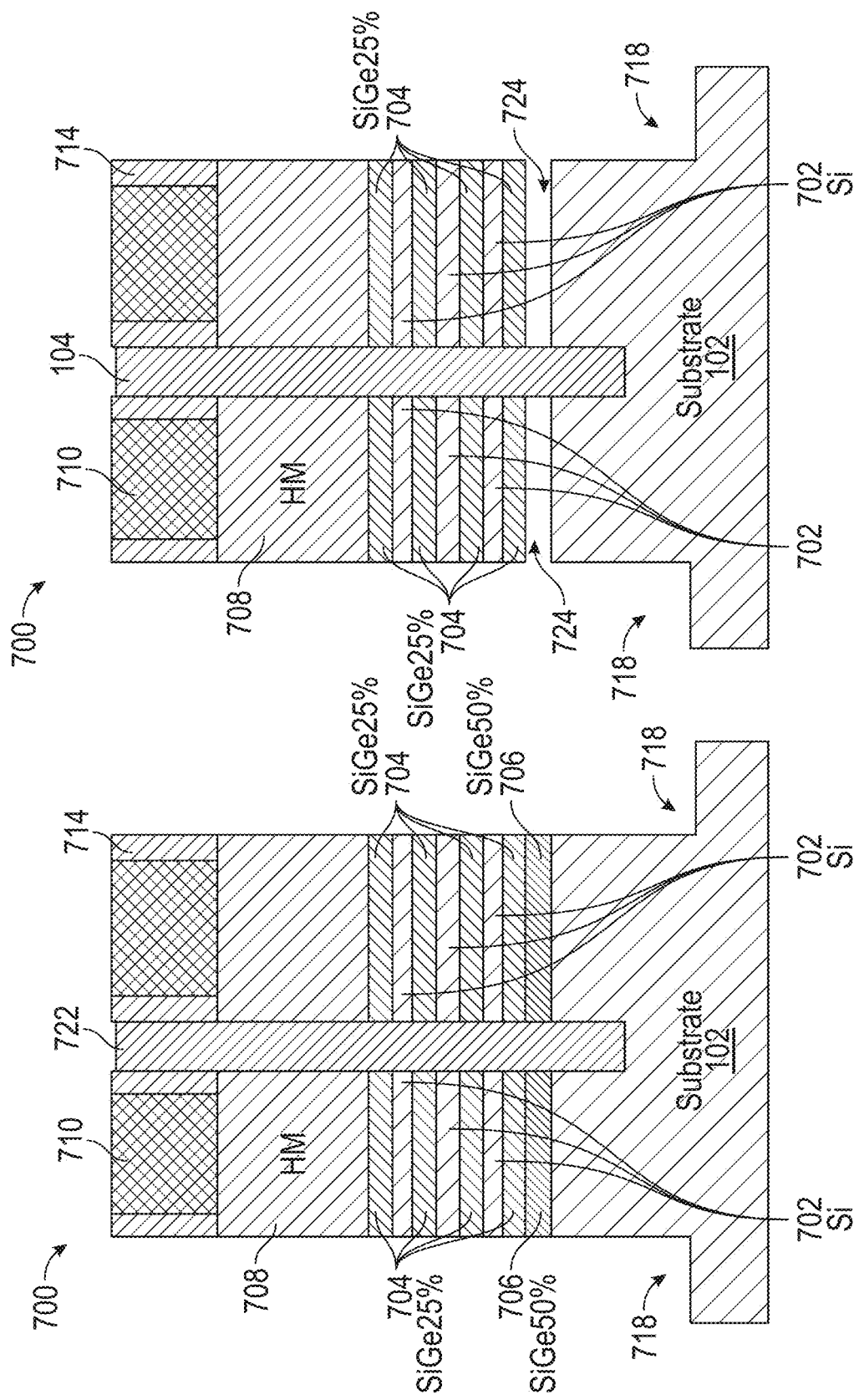

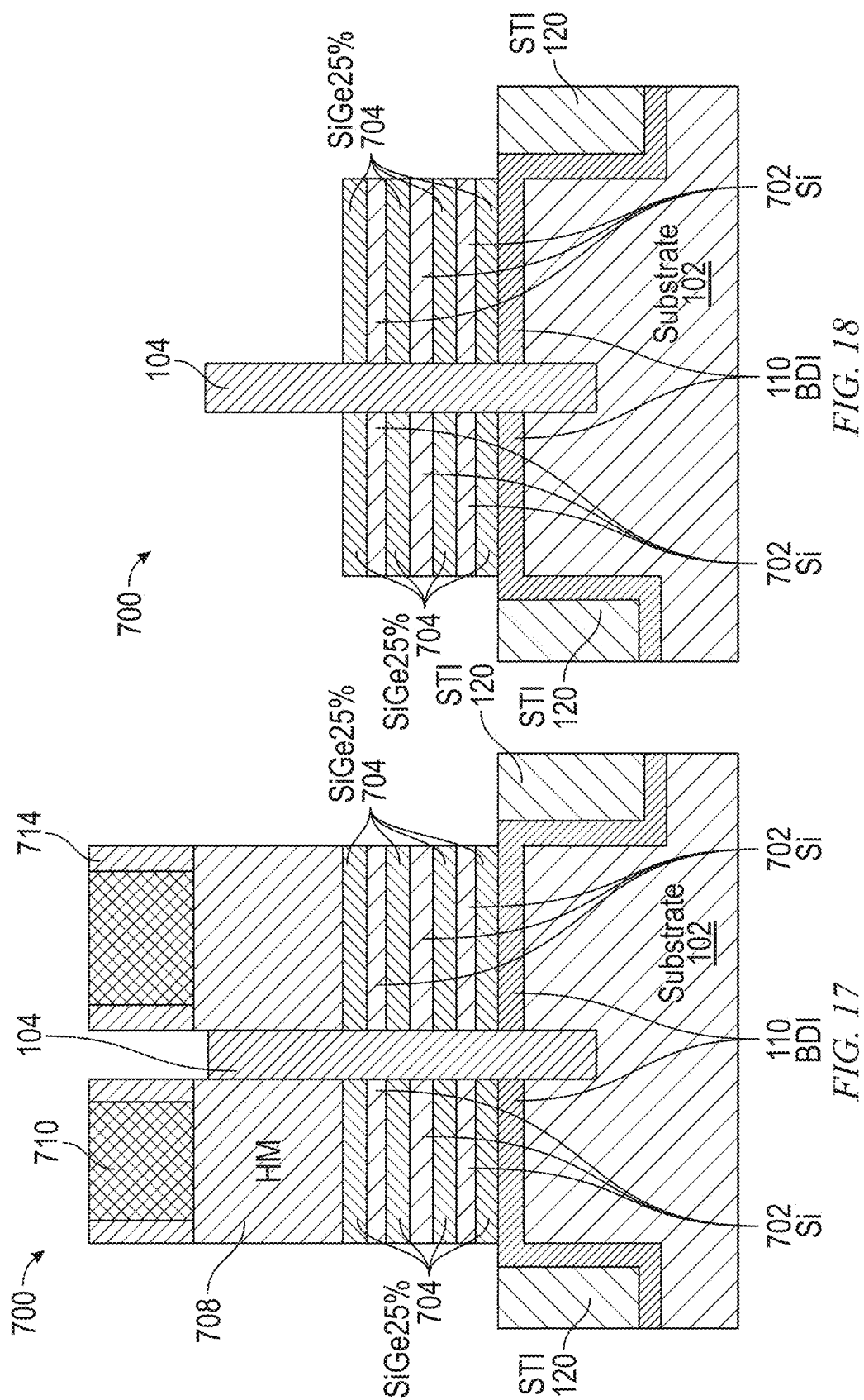

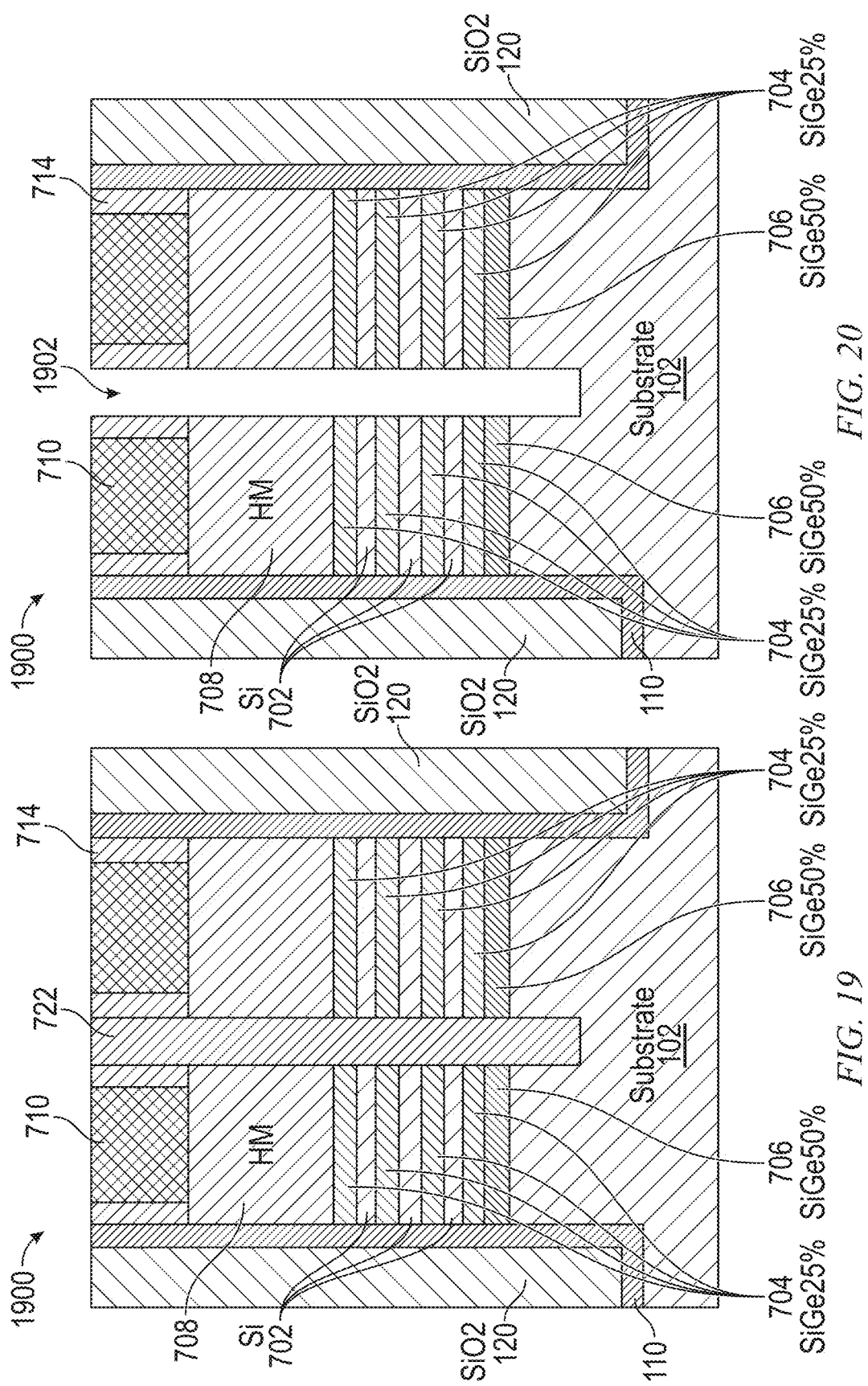

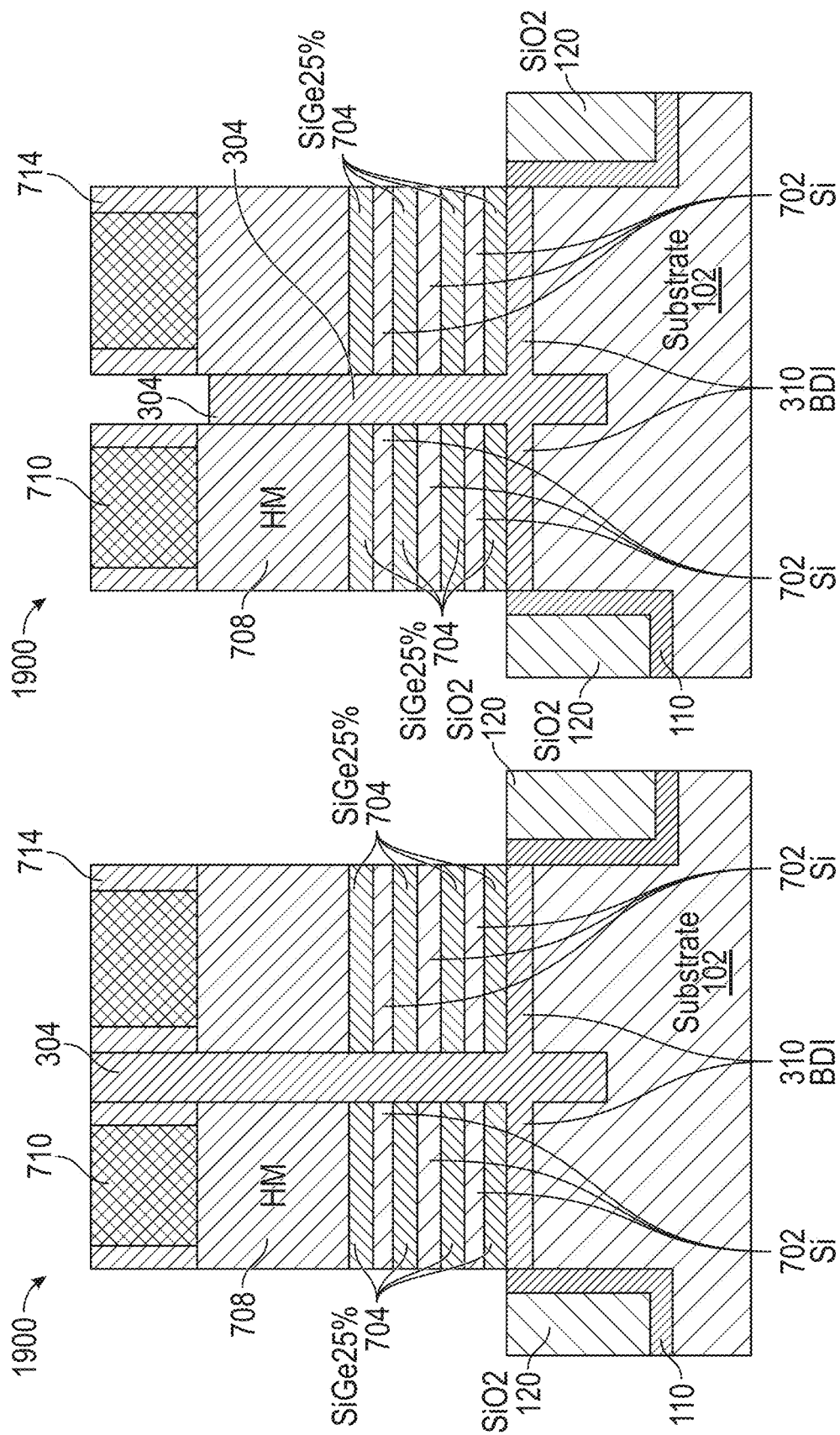

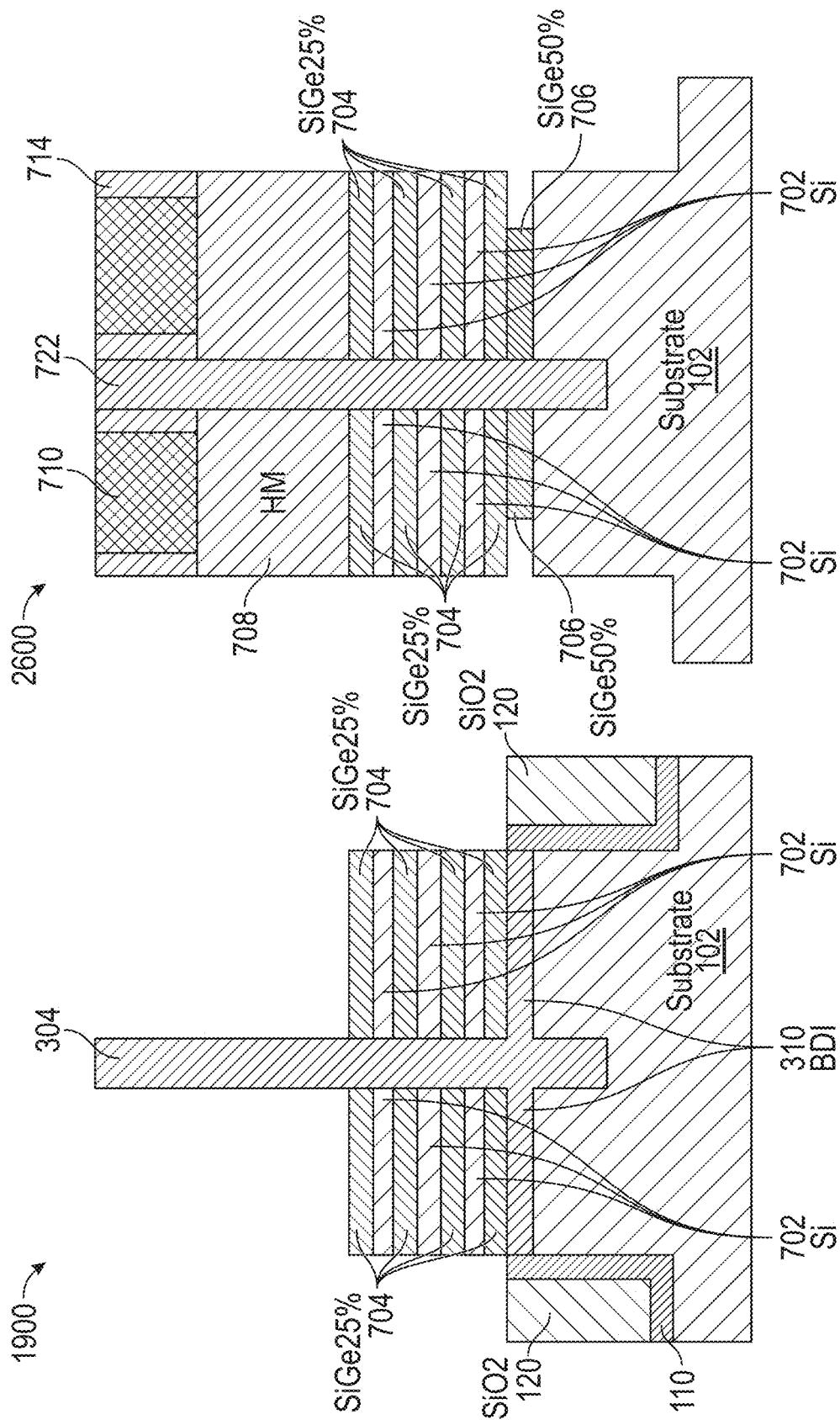

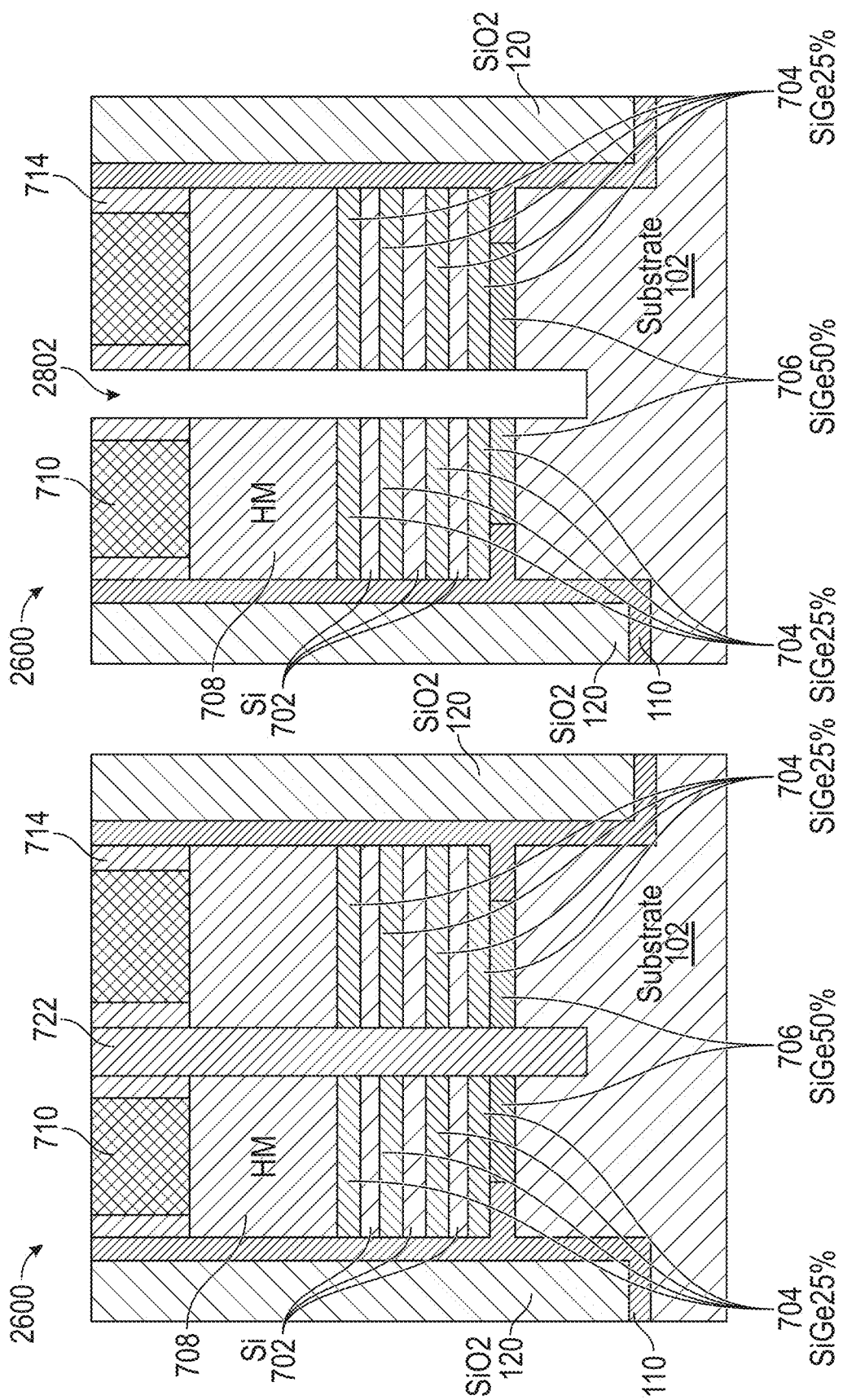

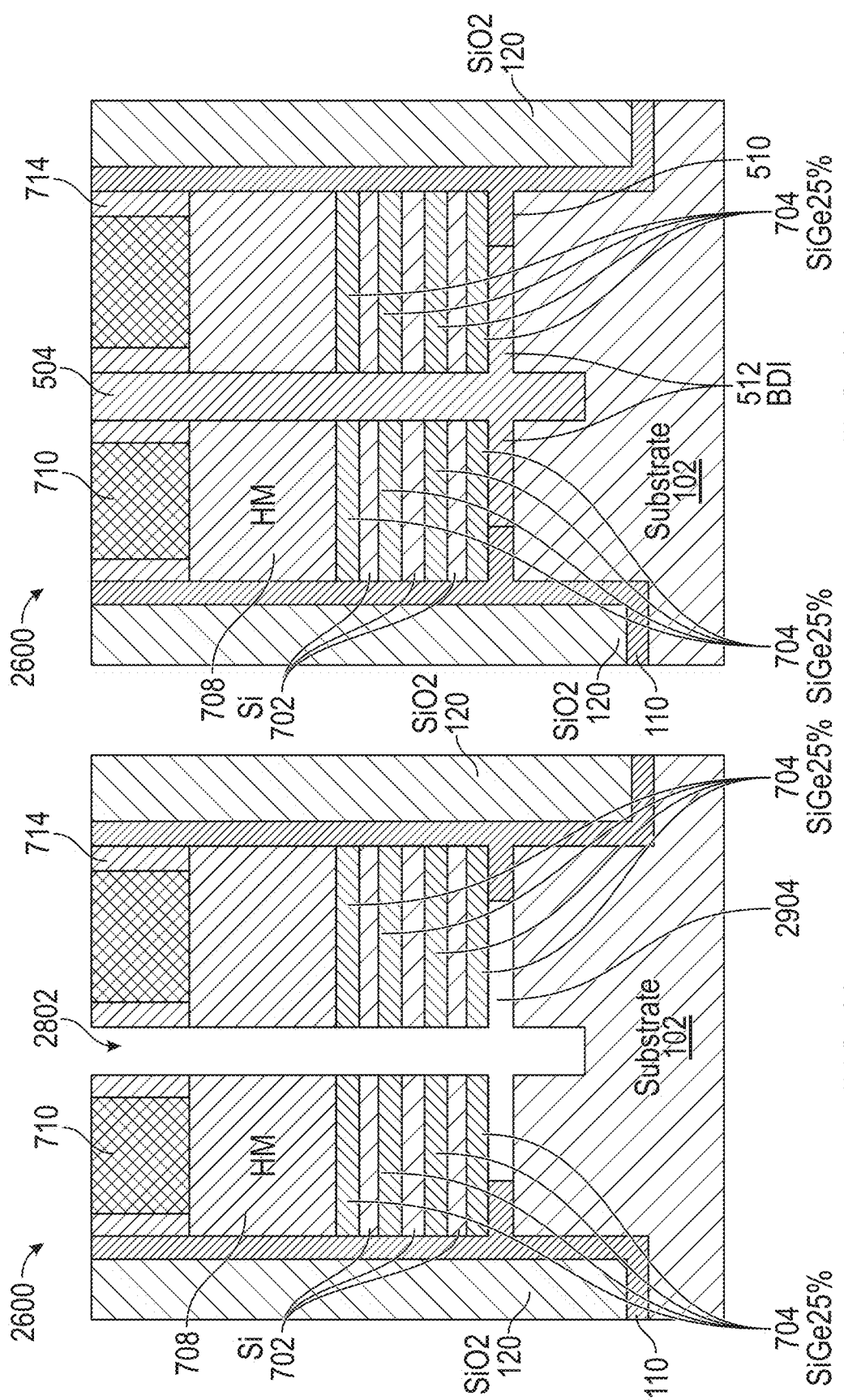

US 12,363,977 B2

FORMING DIELECTRIC SIDEWALL AND BOTTOM DIELECTRIC ISOLATION IN FORK-FET DEVICES

BACKGROUND

The present invention relates to the electrical, electronic, and computer arts, and more specifically, to nanosheet semiconductor devices.

Particular embodiments of the invention relate to Fork-FET devices. Fork-FET has been proposed as a next generation of field effect transistor (FET) architecture to further improve cell height scaling in which multiple layers of silicon form fork-like protrusions horizontally from sides of a central vertical fin.

SUMMARY

Principles of the invention provide techniques for forming dielectric sidewall and bottom dielectric isolation in Fork-FET devices.

In one aspect, an exemplary apparatus includes a substrate; a central vertical pillar of dielectric material protruding upward from the substrate; a left plurality of semiconductor fins protruding horizontally from a left side of the central vertical pillar above the substrate; a right plurality of semiconductor fins protruding horizontally from a right side of the central vertical pillar opposite the left plurality of semiconductor fins; a gate stack surrounding the central vertical pillar and the left and right pluralities of semiconductor fins; and a bottom dielectric insulating layer protruding horizontally left and right of the central vertical pillar below the left and right pluralities of fins and adjacent to the substrate.

In another aspect, an exemplary semiconductor structure includes a substrate; a central vertical pillar of dielectric material protruding upward from the substrate; a left plurality of semiconductor fins of a first composition protruding horizontally from a left side of the central vertical pillar above the substrate; a right plurality of semiconductor fins of the first composition protruding horizontally from a right side of the central vertical pillar opposite the left plurality of semiconductor fins; a second composition of semiconductor material interleaved between the left and right pluralities of semiconductor fins of the first composition; left and right semiconductor fins of a third composition protruding horizontally from left and right sides of the central vertical pillar between the substrate and the left and right pluralities of semiconductor fins of the first composition; left and right hard masks touching the central vertical pillar above the left and right pluralities of semiconductor fins of the first composition; patterning material above and touching the hard mask; and spacers between and touching the patterning material and the central vertical pillar.

In another aspect, an exemplary method includes forming on a substrate a stack of nanosheets covered by a hard mask, wherein the stack of nanosheets comprise: a plurality of semiconductor layers of a first composition; a plurality of semiconductor layers of a second composition interleaved between the semiconductor layers of the first composition; and a semiconductor layer of a third composition between the substrate and the plurality of semiconductor layers of the first composition. The method also includes forming on the hard mask a pair of left and right etch masks separated by a pillar gap; narrowing the pillar gap by forming spacers on the etch masks, wherein the spacer partially fill the pillar gap; forming a pillar trench between left and right halves of the stack of nanosheets by etching the hard mask and the stack of nanosheet through the pillar gap; and depositing a central vertical pillar of dielectric material in the pillar trench.

In view of the foregoing, techniques of the present invention can provide substantial beneficial technical effects. For example, one or more embodiments provide one or more of:

A fin patterning method that mitigates fin cut lithography misalignment, which otherwise could result variation in effective gate width ratio between adjacent FET devices of the Fork-FET structure, such as for example a P-type FET and a N-type FET; mitigating misalignment enhances circuit performance.

Early formation of bottom dielectric isolation enables meeting $L_g<15$ nm short channel performance.

Bottom dielectric isolation (BDI) of the source and drain epitaxy from the substrate enhances optimal electrical performances at aggressively scaled gate lengths.

Bottom Dielectric Isolation (BDI) integration provides a mechanically stable wide sheet for Fork-FET devices.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 7, FIG. 8, FIG. 9, FIG. 10, FIG. 11, FIG. 12, and FIG. 13 depict the results of fabrication process steps that are common to the embodiments of FIG. 1 through FIG. 6.

FIG. 14, FIG. 15, FIG. 16, FIG. 17, and FIG. 18 depict the results of fabrication process steps that are specific to the embodiment of FIG. 1 and FIG. 2.

FIG. 19, FIG. 20, FIG. 21, FIG. 22, FIG. 23, FIG. 24, and FIG. 25 depict the results of fabrication process steps that are specific to the embodiment of FIG. 3 and FIG. 4.

FIG. 26, FIG. 27, FIG. 28, FIG. 29, and FIG. 30 depict the results of fabrication process steps that are specific to the embodiment of FIG. 5 and FIG. 6.

DETAILED DESCRIPTION

Figure 1:
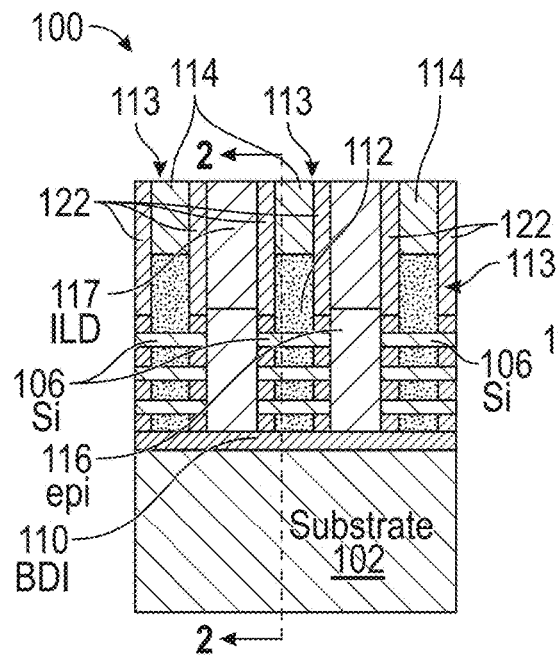
FIG. 1 and FIG. 2 depict an embodiment in which a bottom dielectric insulator is contiguous with a shallow trench liner of a Fork-FET device.
Figure 2:
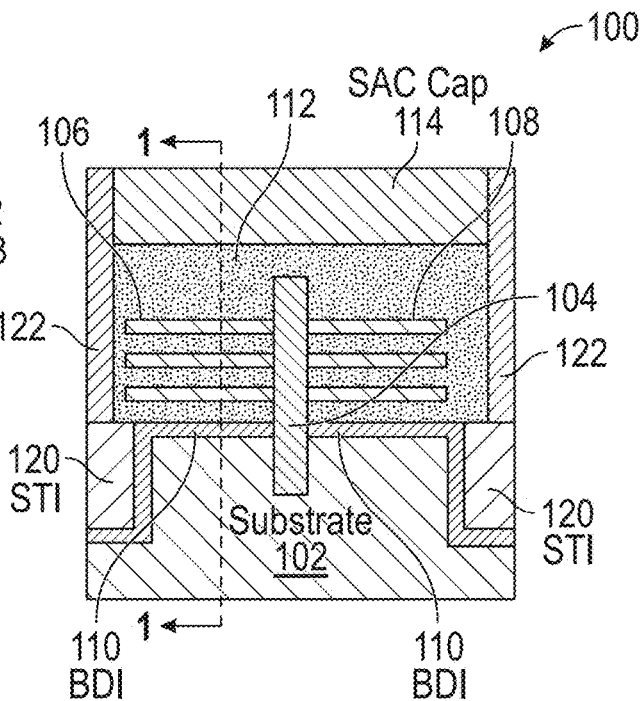

FIG. 1 and FIG. 2 depict a Fork-FET device 100. The view of FIG. 1 is toward the section line 1-1 of FIG. 2; the view of FIG. 2 is toward the section line 2-2 of FIG. 1. The Fork-FET device 100 includes a bottom dielectric insulator 110. The bottom dielectric insulator 110 is integral with a shallow trench liner, which extends under shallow trench isolation 120 at either end of the device 100. The device 100 is fabricated on a substrate 102, with fins 106, 108 protruding from a central vertical pillar 104. In one or more embodiments, one set of fins (e.g., 106) is doped n-type while the other set of fins (e.g., 108) is doped p-type. In one or more embodiments, the fin types may be reversed, but generally, the two sets of fins are differently doped. In one or more embodiments, the fins are epitaxially grown, as further discussed below. A gate stack 112 encapsulates the fins 106, 108 to form gates 113. The gate stack 112 includes at least one dielectric and one conductive material wrapping around the fins 106, 108. An SAC (self-aligned contact) 114 covers the gate stack 112. Epitaxial silicon 116 and interlayer dielectric (ILD) 117 separate adjacent gates 113. Shallow trench isolation 120 and gate cuts 122 cap horizontal ends of the gates 113.

An epitaxial deposition process, as used for fabricating the silicon 116 and portions of the gate 113, may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

Work function metal (WFM) layers are disposed over the gate dielectric layer in both the nFET and pFET regions (in embodiments having both types of regions) to complete the gate stacks 112. Non-limiting examples of suitable work function (gate) metals include p-type work function metal materials and n-type work function metal materials. P-type work function materials include compositions such as ruthenium, palladium, platinum, cobalt, nickel, and conductive metal nitride like TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal(s) may be deposited by a suitable deposition process, for example, ALD, CVD, PECVD, PVD, plating, and thermal or e-beam evaporation. Pinch-off of work function metal material between semiconductor fins is essentially avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. The threshold voltage (Vt) of nFET devices is sensitive to the thickness of work function metals such as titanium nitride (TiN).

In some embodiments, the SAC 114 is a tungsten (W) layer that is deposited using a tungsten hexafluoride source with silane. Chemical vapor deposition conducted between 300-400° C. and using tungsten hexafluoride precursor chemistry may, for example, be employed to deposit a tungsten layer. Contact material may, for example, alternatively include tantalum (Ta), aluminum (Al), platinum (Pt), gold (Au), titanium (Ti), palladium (Pd) or any combination thereof. The contact material may be deposited by, for example, CVD, PECVD, PVD, plating, thermal or e-beam evaporation, or sputtering. A planarization process such as CMP is performed to remove any electrically conductive material (overburden) from the top surface of the structure.

Figure 3:
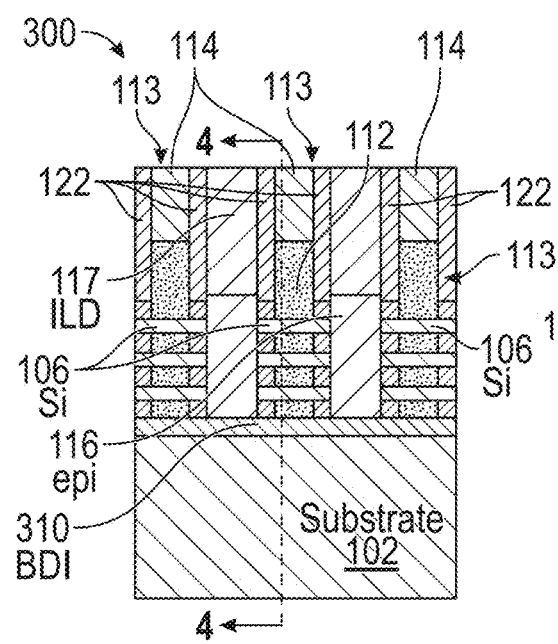
FIG. 3 and FIG. 4 depict an embodiment in which a bottom dielectric insulator is contiguous with a central vertical pillar of a Fork-FET device.
Figure 4:
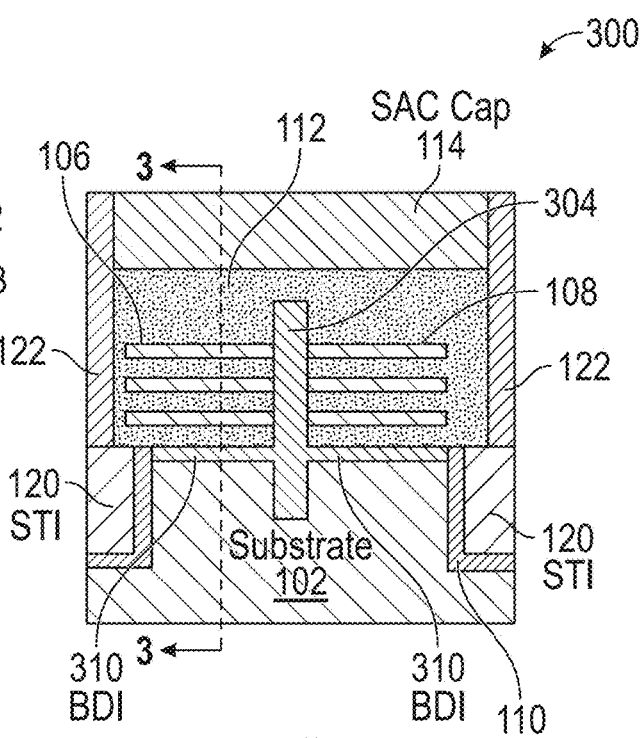

FIG. 3 and FIG. 4 depict a Fork-FET device 300. The view of FIG. 3 is toward the section line 3-3 of FIG. 4; the view of FIG. 4 is toward the section line 4-4 of FIG. 3. The device 300 includes a bottom dielectric insulator 310 that is integral with a central vertical pillar 304 (best seen in FIG. 4). The Fork-FET device 300 otherwise is similar to the Fork-FET device 100.

Figure 5:
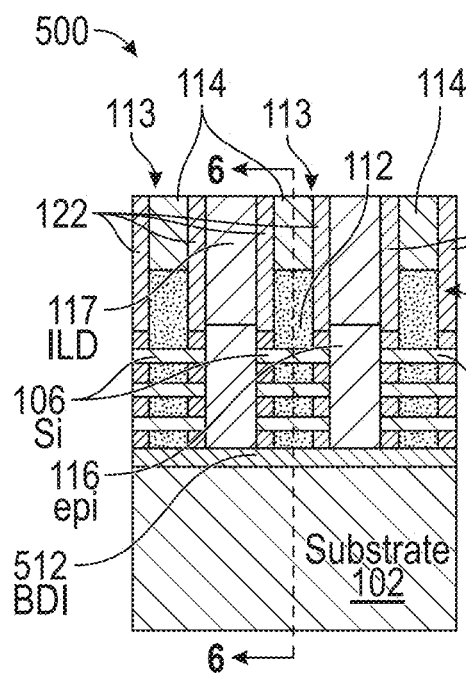
FIG. 5 and FIG. 6 depict an embodiment in which a bottom dielectric insulator is partly contiguous with a central vertical pillar and partly contiguous with a shallow trench liner of a Fork-FET device.
Figure 6:
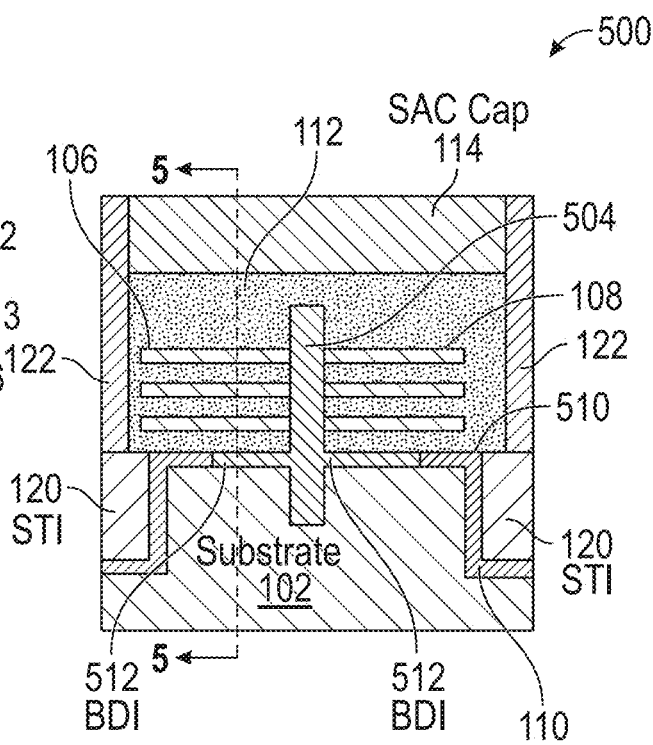

FIG. 5 and FIG. 6 depict a Fork-FET device 500. The view of FIG. 5 is toward the section line 5-5 of FIG. 6; the view of FIG. 6 is toward the section line 6-6 of FIG. 5. The Fork-FET device 500 has a bottom dielectric insulator that comprises a portion 512 that is integral with a central vertical pillar 504 and other portions 510 that are integral with shallow trench liner 110. The Fork-FET device 500 otherwise is similar to the Fork-FET devices 100 and 300.

Figure 7:
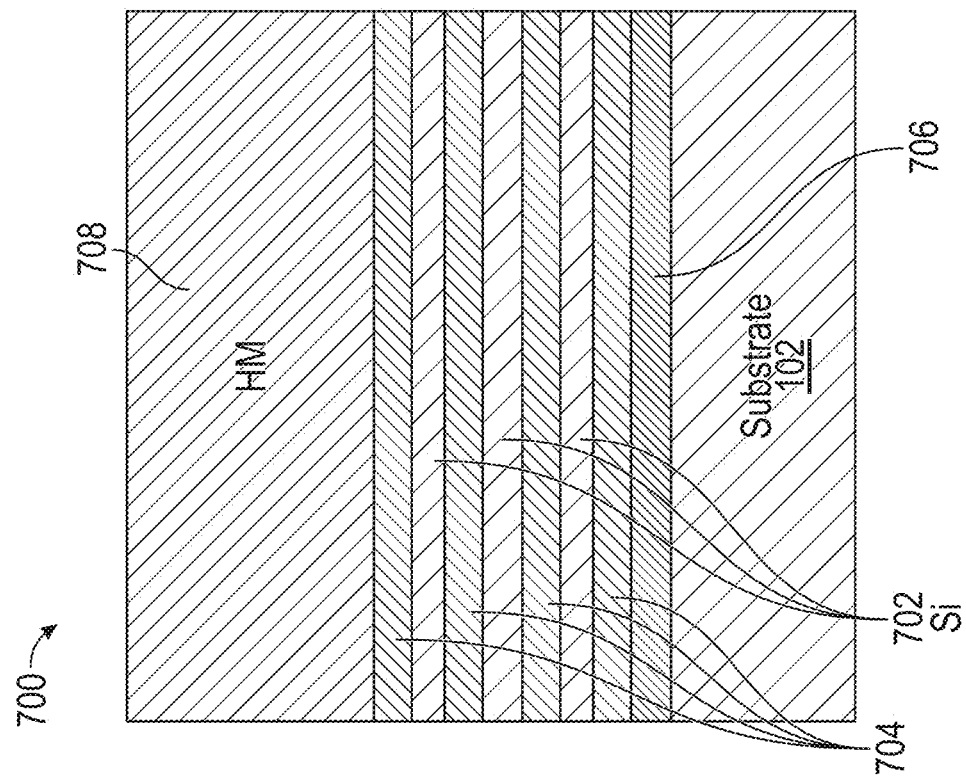

FIG. 7 depicts the results of a manufacturing process step that is common to fabrication of the Fork-FET devices 100, 300, 500. In FIG. 7, a precursor or intermediate semiconductor structure 700 includes a plurality of silicon layers 702, low-germanium SiGe layers 704, and a high-germanium SiGe layer 706 that are deposited on the substrate 102 and capped by a hard mask 708. The silicon layers 702 later will form the fins 106, 108 of the Fork-FET devices. In one or more embodiments, the low-germanium SiGe layers 704 are between 15%-35% molar Ge; in certain embodiments, about 25%. In one or more embodiments, the high-germanium SiGe layers 706 are between 40%-60% Ge; in certain embodiments, about 50%. In one or more embodiments, the multilayer stack 706, 704, 702 is grown epitaxially using sequential layering in an epitaxy chamber. The hard mask 708 can be a single layer or a composite, multi-layer mask.

Figure 8:
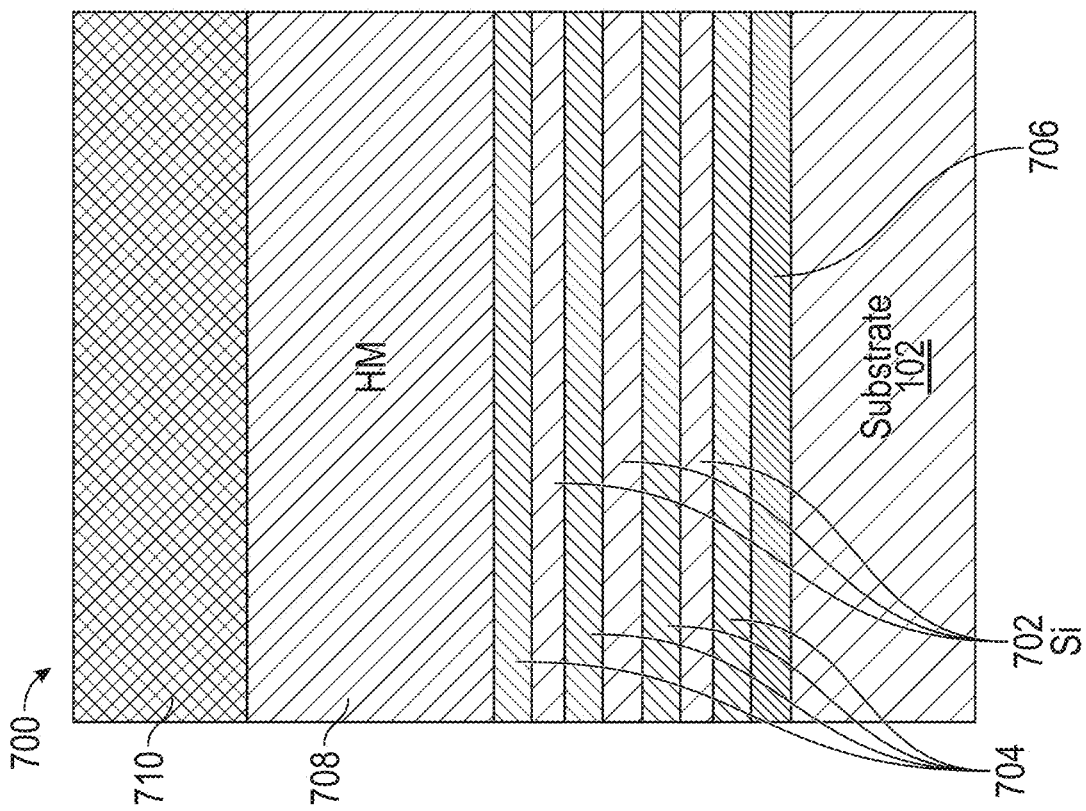

FIG. 8 depicts the results of a subsequent step, in which a patterning mandrel material 710 such as amorphous-silicon (a-Si) has been deposited over the hard mask 708.

FIG. 9 depicts the results of a subsequent step, in which the patterning mandrel material 710 has been partially photolithographed or otherwise removed to form a trench gap 712, which is flanked by pillars still denoted by 710.

FIG. 10 depicts the results of a subsequent step, in which spacers 714 have been formed on the pillars 710 to narrow the trench gap 712. In one or more embodiments, the spacers 714 can be a nitride or an oxide material. Exemplary spacer materials include silicon nitrides, silicon oxides, or aluminum oxides. In one or more embodiments, other suitable spacer materials can be substituted.

Figures 11, 12:
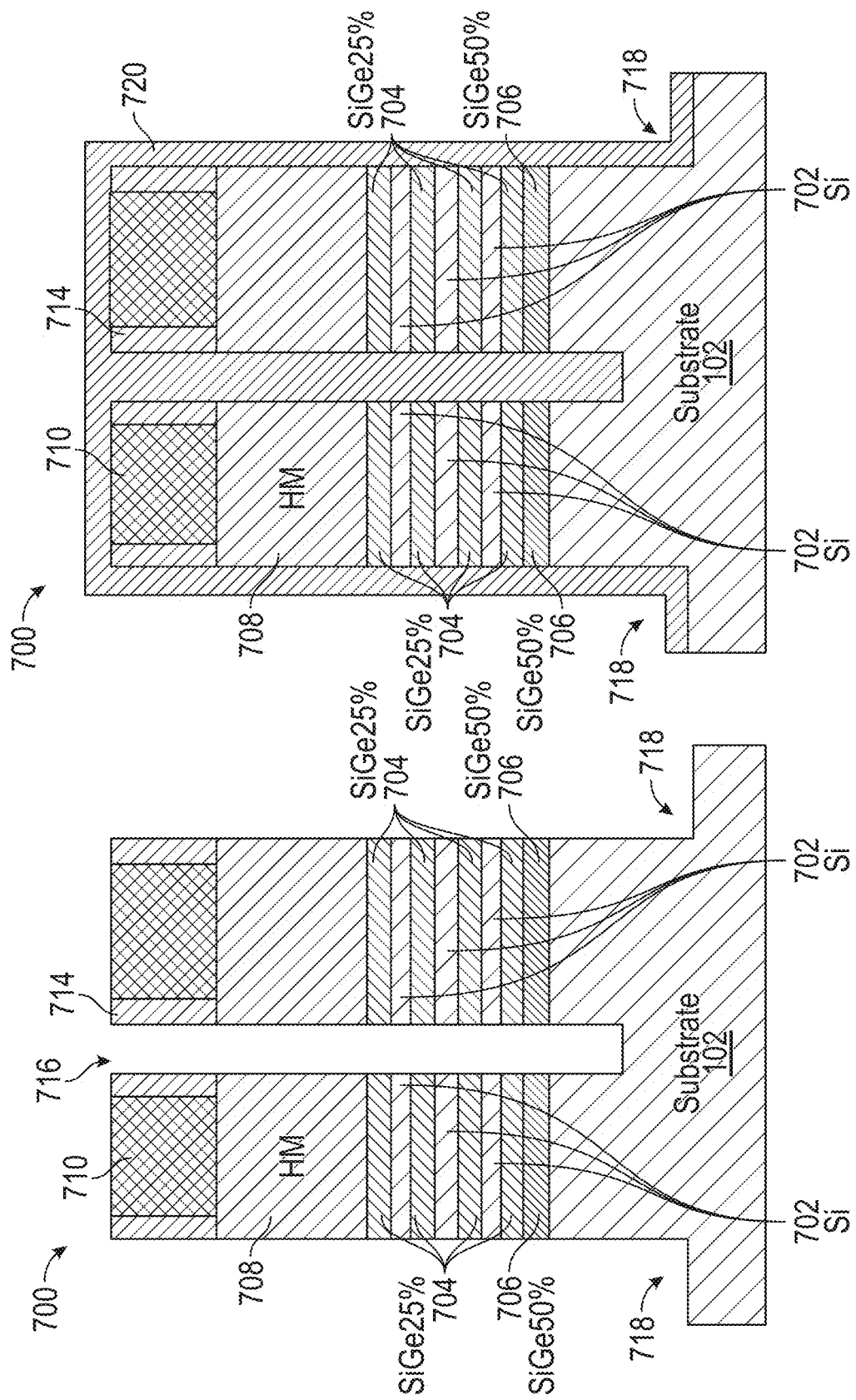

FIG. 11 depicts the results of a subsequent step, in which reactive ion etching (ME) has been used to form a central trench 716 and side trenches 718. Due to the loading effect or lag of RIE, the side trenches 718 generally will be deeper than the central trench 716. This is helpful but not essential for later steps.

FIG. 12 depicts the results of a subsequent step, in which a first or sacrificial dielectric liner 720 has been deposited into the central trench 716, side trenches 718, and over the whole structure 700. In one or more embodiments, the sacrificial dielectric liner 720 may be silicon carbide.

FIG. 13 depicts the results of a subsequent step, in which the sacrificial dielectric liner 720 has been etched back to leave only a first central vertical pillar 722. Assuming the sacrificial dielectric liner 720 is SiC, then in one or more embodiments, $SF_6/O_2$ inductively coupled plasma (ICP) could be used for the etch back. After the step of FIG. 13, further steps for fabricating each of the Fork-FETs 100, 300, 500 diverge from the others.

FIG. 14 depicts the results of a subsequent step for forming the Fork-FET 100, in which the high-germanium SiGe layer 706 has been selectively etched to form a horizontal gap 724. In one or more embodiments, a HCl vapor phase process is used to selectively etch the high-germanium SiGe without removing the low-germanium SiGe layers or the silicon layers. Note in the process depicted by FIG. 14 through FIG. 18, the first central vertical pillar becomes the central vertical pillar 104 of the finished Fork-FET device 100.

Figure 15:
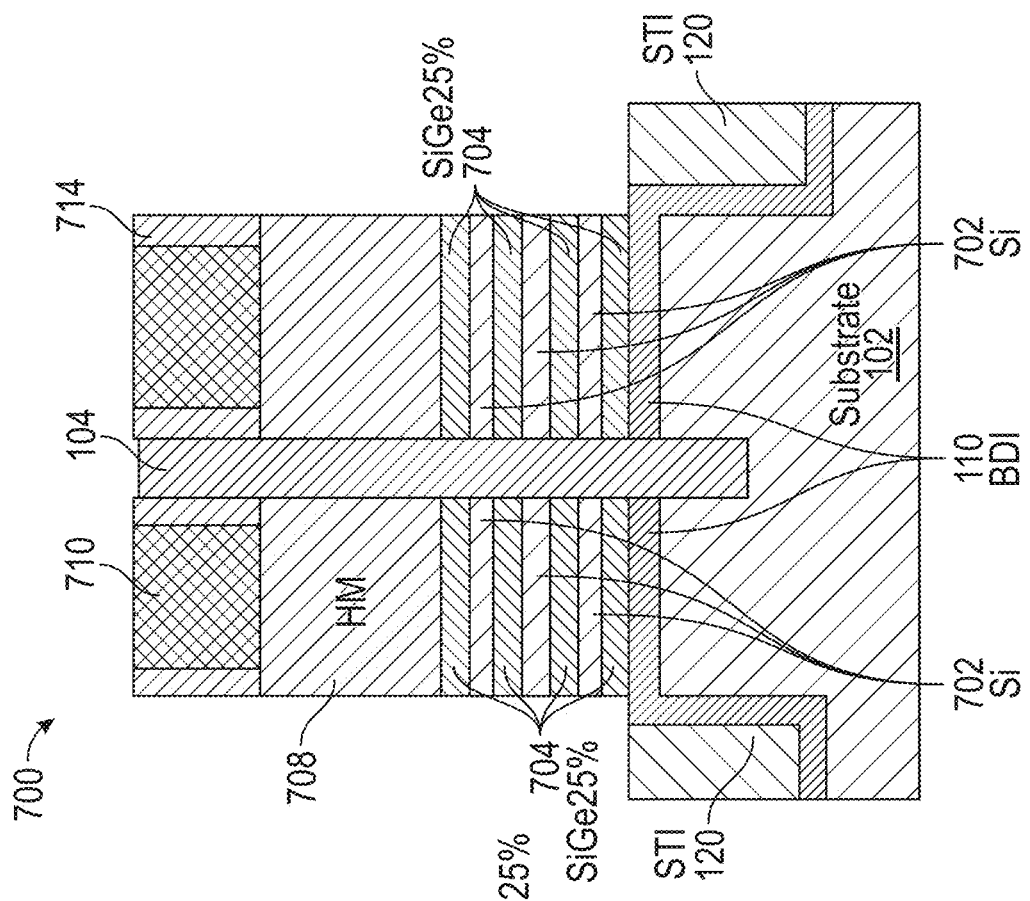

FIG. 15 depicts the results of a subsequent step for forming the Fork-FET 100, in which a second dielectric liner 110 is deposited to form bottom dielectric isolation filling the horizontal gap 724 as well as liners for the shallow trenches 718.

Figure 16:
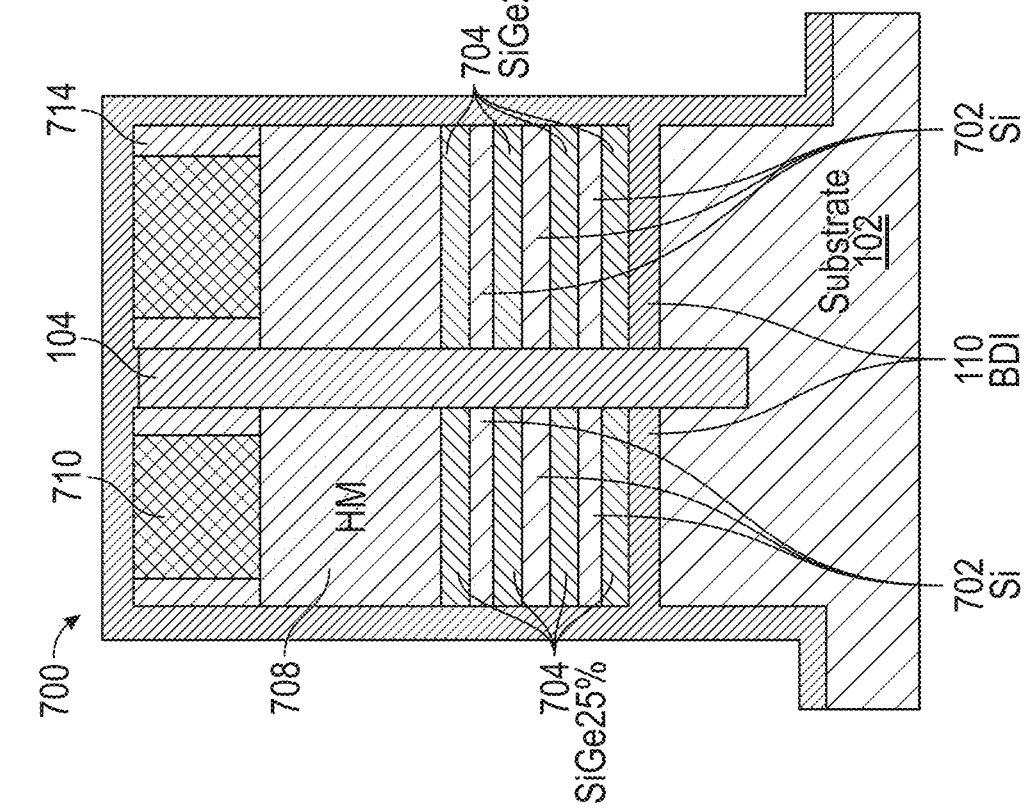

FIG. 16 depicts the results of a subsequent step for forming the Fork-FET 100, in which shallow trench isolation (STI) 120 has been deposited, chemical-mechanical planarization has been accomplished, the STI 120 has been etched down, and the second dielectric liner 110 has been selectively etched. In one or more embodiments, the second dielectric liner 110 is a nitride liner and a hot liquid $H_3PO_4$ process is used to selectively etch the nitride without removing the silicon layers and SiGe layers.

FIG. 17 depicts the results of a subsequent step for forming the Fork-FET 100, in which the central vertical pillar 104 is selectively etched to reduce its height. $SF_6/O_2$ inductively coupled plasma (ICP) could be used for the etch back.

FIG. 18 depicts the results of a subsequent step for forming the Fork-FET 100, in which the a-Si 710, spacers 714, and hard mask 708 have been removed by conventional means.

FIG. 19 depicts the results of a subsequent step for forming the Fork-FET 300, in which a second dielectric liner 110 (typically silicon nitride) and silicon oxide shallow trench isolation (STI) 120 are deposited. $SiO_2$ is shown for the STI 120. In one or more embodiments, the resultant structure 1900 then is chemical-mechanically planarized.

FIG. 20 depicts the results of a subsequent step for forming the Fork-FET 300, in which the central vertical pillar 722 is etched to form a central trench 1902. In one or more embodiments, when the central vertical pillar 722 is silicon carbide, it can be etched by, e.g., $SF_6/O_2$ inductively coupled plasma (ICP).

Figures 21, 22:
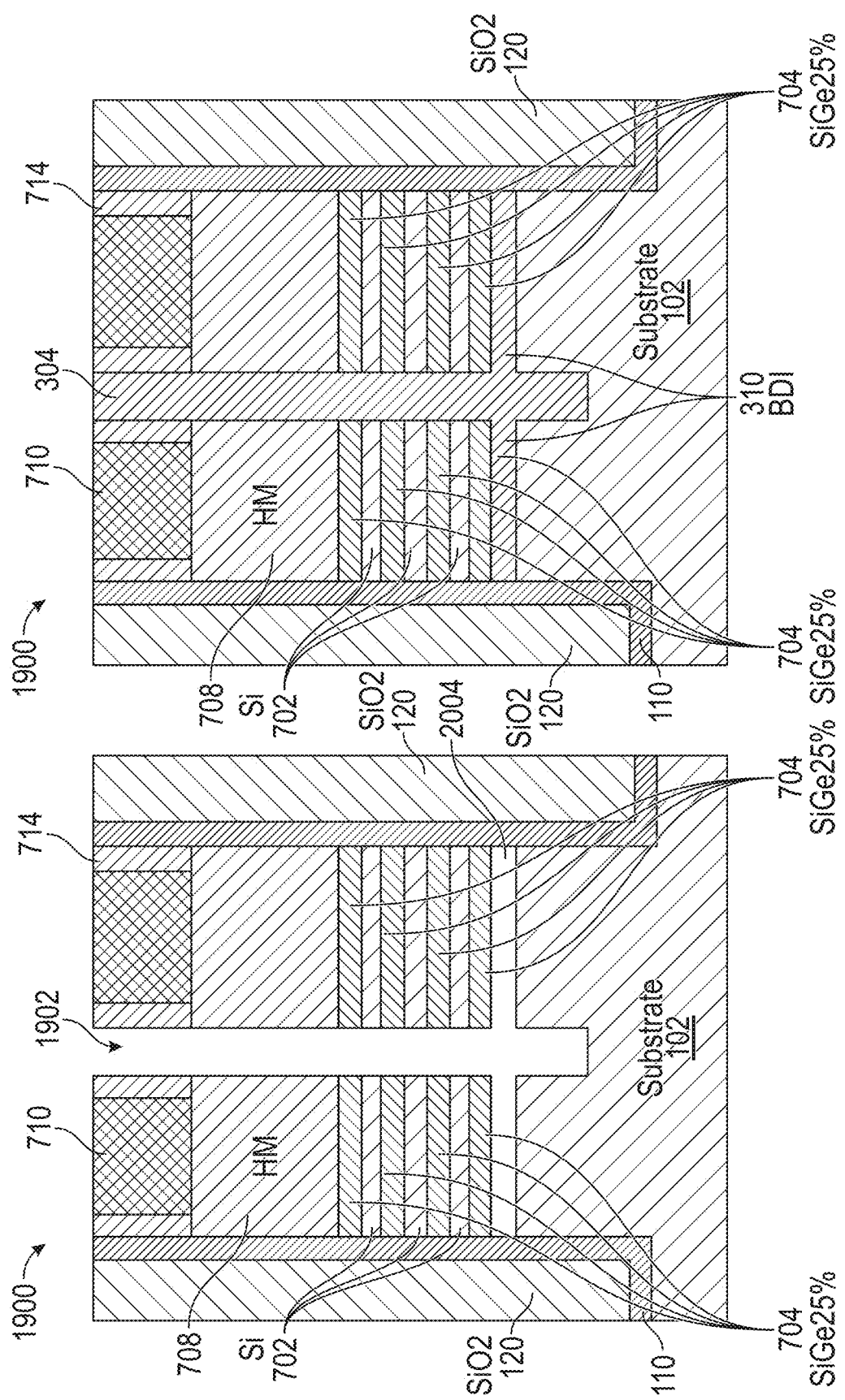

FIG. 21 depicts the results of a subsequent step for forming the Fork-FET 300, in which the high-germanium SiGe layer 706 is selectively etched (in a similar manner as in FIG. 14, discussed above) to form a horizontal gap 2004 between the fin stack and the substrate 102.

FIG. 22 depicts the results of a subsequent step for forming the Fork-FET 300, in which a dielectric is deposited into the horizontal gap 2004 and the central trench 1902 to form a bottom dielectric insulator 310 that is integral with a central vertical pillar 304. In one or more embodiments, the bottom dielectric insulator 310 includes a low-k material such as: SiBCN, SiOC, SiOCN.

FIG. 23 depicts the results of a subsequent step for forming the Fork-FET 300, in which the structure 1900 has been chemical-mechanically planarized and the STI 120 and dielectric liner 110 have been selectively etched, in a similar manner as in FIG. 16.

FIG. 24 depicts the results of a subsequent step for forming the Fork-FET 300, in which the central vertical pillar 304 has been selectively etched to reduce its height, in a similar manner as in FIG. 17. In one or more embodiments, when the central vertical pillar 304 is SiBCN, hot liquid $H_3PO_4$ could be used as the etchant.

FIG. 25 depicts the results of a subsequent step for forming the Fork-FET 300, in which the a-Si 710, spacers 714, and hard mask 708 have been removed by conventional means.

Following the steps depicted in FIG. 18 and FIG. 25, the low-germanium SiGe layers 704 are selectively etched (e.g., by vapor phase HCl or vapor phase $ClF_3$). Then gate stack 112 is deposited and other materials are deposited, chemical-mechanically planarized, etched, etc. in a conventional manner to form the final Fork-FET devices 100 or 300.

FIG. 26 depicts the results of a subsequent step for forming the Fork-FET 500, in which the high-germanium SiGe layer 706 has been partially selectively etched to leave a supportive platform under the fin stack in a structure 2600.

FIG. 27 depicts the results of a subsequent step for forming the Fork-FET 500, in which a second dielectric liner 110 and silicon oxide shallow trench isolation (STI) 120 are deposited. SiO2 is shown for the STI 120. In one or more embodiments, the resultant structure 2600 then is chemical-mechanically planarized. The second dielectric liner 110 now supports the fin stack of the structure 2600, in addition to the platform formed by the remaining high-germanium SiGe layer 706. The portions of the second dielectric liner 110 that are between the fin stack and the substrate will become distal portions 510 of the bottom dielectric isolation.

FIG. 28 depicts the results of a subsequent step for forming the Fork-FET 500, in which the sacrificial central vertical pillar 722 is selectively etched to form a central trench 2802.

FIG. 29 depicts the results of a subsequent step for forming the Fork-FET 500, in which the remaining platform formed by the high-germanium SiGe 706 is removed by selective etching (in a similar manner as in FIG. 14, discussed above), thereby forming a gap 2904.

FIG. 30 depicts the results of a subsequent step for forming the Fork-FET 500, in which a dielectric is deposited into the gap 2904 and into the central trench 2802 to form a bottom dielectric insulator central portion 512 that is integral and continuous with a central vertical pillar 504.

Following the steps depicted in FIG. 30, the STI 120 and trench liner 110 are selectively etched, the a-Si 710, spacers 714, and hard mask 708 are removed, the central vertical pillar 304 is reduced, the low-germanium SiGe layers 704 are selectively etched, gate stack 112 is deposited and other materials are deposited, chemical-mechanically planarized, etched, etc. in a conventional manner to form the final Fork-FET device 500.

It should be noted that, for Gate-All-Around (GAA) devices formed on a bulk substrate, source and drain regions typically are epitaxially grown from (1) the side of the silicon sheets and (2) the bottom silicon substrate. This leads to parasitic source and drain leakage harming nanosheet FET performance. Particularly, the combination of the (1) epitaxy contacting the substrate in the source/drain region and (2) the metal gate stack formed directly on the substrate in the sub-fin region form a bottom parasitic planar transistor degrading the performance of the GAA-FET.

A bottom dielectric isolation layer, as in embodiments of the invention, isolates the source and drain regions from the substrate and/or isolates the nanosheet region (or sub-Fin region) from the substrate. Particularly, embodiments of the invention provide silicon-on-insulator (SOI) like isolation on a bulk substrate without requiring additional masks to form anchors in the fabrication process. Thus, certain embodiments of the invention mitigate the performance degradation presented by a bottom parasitic planar transistor.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, and with reference to the accompanying drawings, it will be appreciated that, in general terms, an exemplary apparatus, according to an aspect of the invention, includes a substrate 102; a central vertical pillar 104 or 304 of dielectric material protruding upward from the substrate; a left plurality of semiconductor fins 106 protruding horizontally from a left side of the central vertical pillar above the substrate; a right plurality of semiconductor fins 108 protruding horizontally from a right side of the central vertical pillar opposite the left plurality of semiconductor fins; a gate stack 112 surrounding the central vertical pillar and the left and right pluralities of semiconductor fins; and a bottom dielectric insulating layer 110, 310, or 510 and 512 protruding horizontally left and right of the central vertical pillar below the left and right pluralities of fins and adjacent to the substrate. It will be appreciated by an ordinary skilled worker that "left" and "right" as well as "vertical" and "horizontal" are terms of convenience, and that in a commercial implementation the components of the apparatus may be oriented in other directions so long as a similar physical relationship is maintained among the components.

In one or more embodiments, the central vertical pillar protrudes into the substrate.

In one or more embodiments, the bottom dielectric insulating layer 310 is of a same material as, and integral with, the central vertical pillar.

In one or more embodiments, as shown for example in FIGS. 2, 4, and 6, the gate stack 112 extends beyond ends of the left and right pluralities of semiconductor fins to trenches that are indented into the substrate. In these embodiments, the apparatus also comprises a dielectric liner 110 covering the bottoms of the trenches; and a shallow trench insulation material 120 filling the trenches above the dielectric liner.

In one or more embodiments, as shown for example in FIG. 2, the bottom dielectric insulating layer 110 is of a same material as, and integral with, the dielectric liner.

In one or more embodiments, as shown for example in FIG. 6, the bottom dielectric insulating layer comprises a portion 512 adjacent the central vertical pillar 304 that is of a same material as, and integral with, the central vertical pillar, and a portion 510 distal from the central vertical pillar 304 that is of a same material as, and integral with, the dielectric liner 110.

In one or more embodiments, a semiconductor structure 700, 1900, or 2600 includes a substrate 102; a central vertical pillar 722 of dielectric material protruding upward from the substrate; a left plurality of semiconductor fins 106 of a first composition protruding horizontally from a left side of the central vertical pillar above the substrate; a right plurality of semiconductor fins 108 of the first composition protruding horizontally from a right side of the central vertical pillar opposite the left plurality of semiconductor fins; a second composition of semiconductor material 704 interleaved between the left and right pluralities of semiconductor fins of the first composition; left and right semiconductor fins 706 of a third composition protruding horizontally from left and right sides of the central vertical pillar between the substrate and the left and right pluralities of semiconductor fins of the first composition; left and right hard masks 708 touching the central vertical pillar above the left and right pluralities of semiconductor fins of the first composition; patterning material 710 above and touching the hard mask; and spacers 714 between and touching the patterning material and the central vertical pillar.

According to another aspect, an exemplary method 3100 (depicted in FIG. 31) includes, at 3102, forming on a substrate 102 a stack of nanosheets covered by a hard mask 708. The stack of nanosheets comprises a plurality of semiconductor layers 702 of a first composition; a plurality of semiconductor layers 704 of a second composition interleaved between the semiconductor layers of the first composition; and a semiconductor layer 706 of a third composition between the substrate and the plurality of semiconductor layers of the first composition. The method 3100 further comprises, at 3104, forming on the hard mask a pair of left and right etch masks 710 that are separated by a pillar gap 712; at 3106, narrowing the pillar gap by forming spacers 714 on the etch masks, wherein the spacer partially fill the pillar gap. The method 3100 further comprises, at 3108, forming a pillar trench 716 between left and right halves of the stack of nanosheets by etching the hard mask and the stack of nanosheet through the pillar gap. The method 3100 further comprises, at 3110, depositing a central vertical pillar 722 of dielectric material in the pillar trench.

In one or more embodiments, forming the pillar trench also includes etching the substrate through the pillar gap, as shown for example in FIG. 11.

In one or more embodiments, the central vertical pillar extends from within the substrate up to a top surface of the left and right etch masks, as shown for example in FIG. 12 or FIG. 13.

Figure 31:
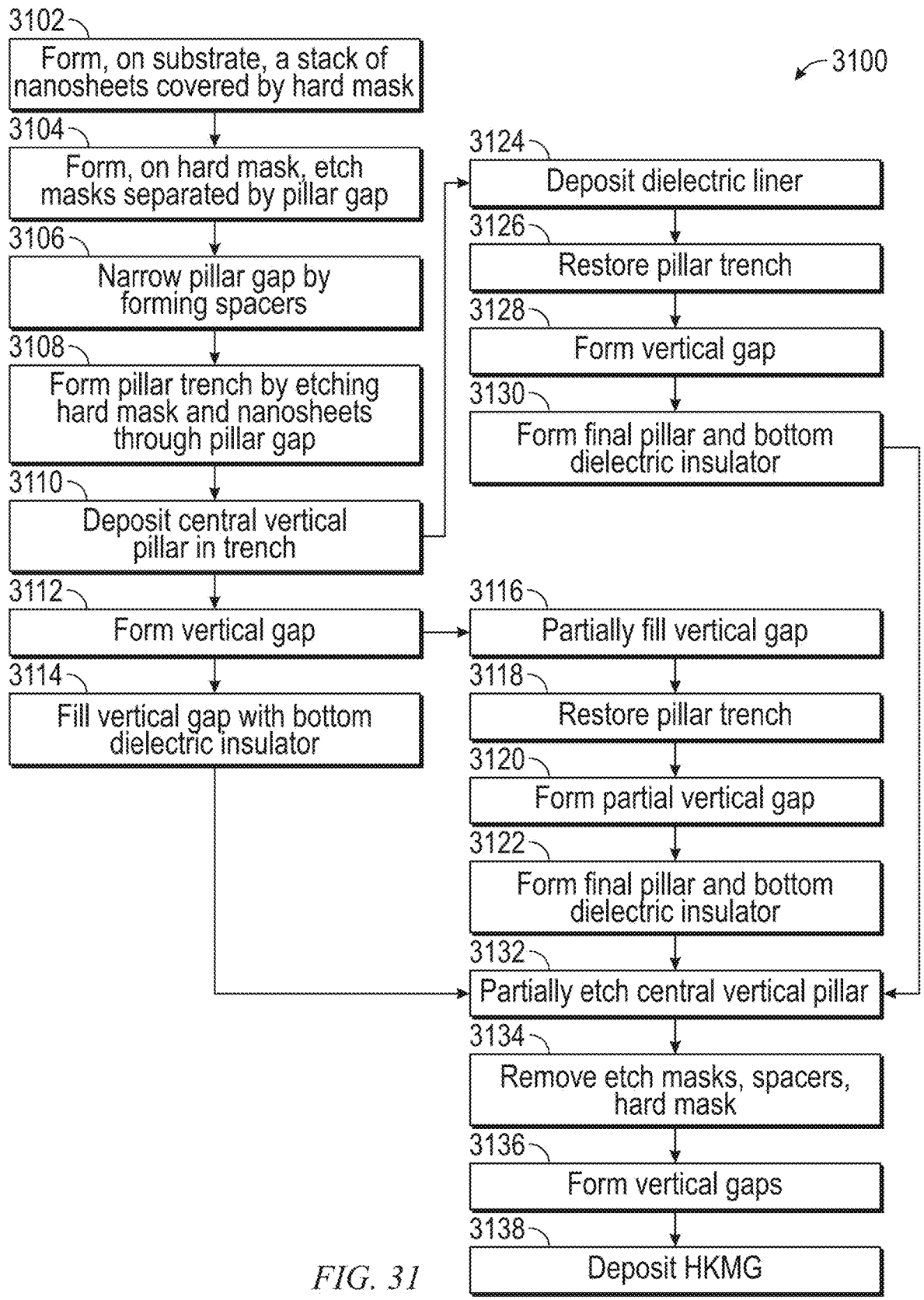
FIG. 31 depicts in a branching flowchart three variant methods for implementing the processes shown in FIGS. 7-18, FIGS. 7-13 and 19-25, and FIGS. 7-13 and 26-30, respectively.

In one or more embodiments, as shown by a first (lower left) branch of the flowchart in FIG. 31, the method 3100 further comprises, at 3112, forming a vertical gap between the stack of nanosheets and the substrate by selectively etching the semiconductor layer of the third composition from left and right sides of the stack of nanosheets, wherein the central vertical pillar supports the stack of nanosheets above the substrate. The method also comprises, at 3114, filling the vertical gap between the stack of nanosheets and the substrate by depositing a dielectric liner over the stack of nanosheets and the substrate. Then the method proceeds to 3132, partially etching the central vertical pillar.

In one or more embodiments, the vertical gap extends only partway from the left and right sides of the stack of nanosheets toward the central vertical pillar, and a part of the vertical gap remains filled by remnants of the semiconductor layer of the third composition. In such embodiments, as shown by a second (middle right) branch of the flowchart in FIG. 31, the central vertical pillar is a sacrificial pillar, and the method further comprises, at 3116, filling the vertical gap between the stack of nanosheets and the substrate and forming distal portions of a bottom dielectric insulator by depositing a dielectric liner over the stack of nanosheets and the substrate; at 3118, restoring the pillar trench by selectively etching the sacrificial pillar; at 3120, forming a partial vertical gap between the stack of nanosheets and the substrate by selectively etching the remnants of the semiconductor layer of the third composition from the pillar trench, wherein the dielectric liner supports the stack of nanosheets above the substrate; and, at 3122, forming a final vertical pillar and a central portion of the bottom dielectric insulator by depositing a dielectric material into the partial vertical gap and the pillar trench. The method then proceeds to 3132, partially etching the central vertical pillar.

In one or more embodiments, as shown by a third (upper right) branch of the flowchart in FIG. 31, the central vertical pillar is a sacrificial pillar, and the method further comprises, at 3124, depositing a dielectric liner over the substrate and the stack of nanosheets; at 3126, restoring the pillar trench by selectively etching the sacrificial pillar; and, at 3128, forming a vertical gap between the stack of nanosheets and the substrate by selectively etching the semiconductor layer 706 of the third composition from the pillar trench, wherein the dielectric liner 110 supports the stack of nanosheets above the substrate. In such embodiments, the method further comprises, at 3130, forming a final vertical pillar and a bottom dielectric insulator by depositing a dielectric material into the vertical gap and the pillar trench. The method then proceeds to 3132, partially etching the central vertical pillar.

In one or more embodiments, the method further comprises, at 3132, etching the central vertical pillar partially into the pillar trench, but above an uppermost sheet of the stack of nanosheets.

In one or more embodiments, the method further comprises, at 3134, removing the left and right etch masks, the spacers, and the hard mask.

In one or more embodiments, the method further comprises, at 3136, forming a plurality of vertical gaps between the plurality of semiconductor layers 702 of the first composition by selectively etching the plurality of semiconductor layers 704 of the second composition; and, at 3138, depositing a gate stack into the plurality of vertical gaps.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Where terms such as left, right, horizontally, vertically, top, or bottom are used, it is to be understood that these are nonce words for convenience of description and illustration, not limiting the positions of components in a finished product, which could be differently oriented so long as their relative positions are functionally maintained.

What is claimed is:

1. An apparatus comprising:
a substrate;
a central vertical pillar of dielectric material protruding upward from the substrate;
a left plurality of semiconductor fins protruding horizontally from a left side of the central vertical pillar above the substrate;
a right plurality of semiconductor fins protruding horizontally from a right side of the central vertical pillar opposite the left plurality of semiconductor fins;
left and right hard masks touching the central vertical pillar above the left and right plurality of semiconductor fins;
spacers and patterning material covering a surface of the left and right hard mask, the surface being opposite the left and right pluralities of semiconductor fins, wherein the spacers are on inner and outer distal ends of the patterning material and the spacers on the inner distal ends of the patterning material touch the central vertical pillar; and
a bottom dielectric insulating layer protruding horizontally left and right of the central vertical pillar below the left and right pluralities of fins and adjacent to the substrate.

2. The apparatus of claim 1, wherein the central vertical pillar protrudes into the substrate.

3. The apparatus of claim 2, wherein the bottom dielectric insulating layer is of a same material as, and integral with, the central vertical pillar.

4. The apparatus of claim 2, wherein trenches are indented into the substrate, further comprising:
a dielectric liner covering the bottoms of the trenches; and
a shallow trench insulation material filling the trenches above the dielectric liner.

5. The apparatus of claim 4, wherein the bottom dielectric insulating layer is of a same material as, and integral with, the dielectric liner.

6. The apparatus of claim 4, wherein the bottom dielectric insulating layer comprises a portion adjacent the central vertical pillar that is of a same material as, and integral with, the central vertical pillar, and a portion distal from the central vertical pillar that is of a same material as, and integral with, the dielectric liner.

7. A semiconductor structure comprising:
a substrate;
a central vertical pillar of dielectric material protruding upward from the substrate;
a left plurality of semiconductor fins of a first composition protruding horizontally from a left side of the central vertical pillar above the substrate;
a right plurality of semiconductor fins of the first composition protruding horizontally from a right side of the central vertical pillar opposite the left plurality of semiconductor fins;
a second composition of semiconductor material interleaved between the left and right pluralities of semiconductor fins of the first composition;
left and right semiconductor fins of a third composition protruding horizontally from left and right sides of the central vertical pillar between the substrate and the left and right pluralities of semiconductor fins of the first composition;
left and right hard masks touching the central vertical pillar above the left and right pluralities of semiconductor fins of the first composition;
spacers covering inner and outer distal portions of a surface of the left and right hard mask, the surface being opposite the left and right pluralities of semiconductor fins of the first composition, wherein the spacers covering the inner distal portion of the surface of the left and right hard mask touch the central vertical pillar; and
patterning material covering an inner portion of the surface of the left and right hard mask and filling an area between the spacers.

8. A method comprising:
forming on a substrate a stack of nanosheets covered by a hard mask, wherein the stack of nanosheets comprise:
a plurality of semiconductor layers of a first composition;
a plurality of semiconductor layers of a second composition interleaved between the semiconductor layers of the first composition; and
a semiconductor layer of a third composition between the substrate and the plurality of semiconductor layers of the first composition;
forming on a surface of the hard mask opposite the stack of nanosheets, a pair of left and right etch masks separated by a pillar gap;
narrowing the pillar gap by forming spacers on distal ends of the etch masks, wherein the spacers partially fill the pillar gap;
forming a pillar trench between left and right halves of the stack of nanosheets by etching the hard mask and the stack of nanosheet through the pillar gap; and
depositing a central vertical pillar of dielectric material in the pillar trench.

9. The method of claim 8, wherein forming the pillar trench also includes etching the substrate through the pillar gap.

10. The method of claim 9, wherein the central vertical pillar extends from within the substrate up to a top surface of the left and right etch masks.

11. The method of claim 8, further comprising forming a vertical gap between the stack of nanosheets and the substrate by selectively etching the semiconductor layer of the third composition from left and right sides of the stack of nanosheets, wherein the central vertical pillar supports the stack of nanosheets above the substrate.

12. The method of claim 11, further comprising filling the vertical gap between the stack of nanosheets and the substrate by depositing a dielectric liner over the stack of nanosheets and the substrate.

13. The method of claim 11, wherein the vertical gap extends only partway from the left and right sides of the stack of nanosheets toward the central vertical pillar, and a part of the vertical gap remains filled by remnants of the semiconductor layer of the third composition.

14. The method of claim 13, further comprising filling the vertical gap between the stack of nanosheets and the substrate and forming distal portions of a bottom dielectric insulator by depositing a dielectric liner over the stack of nanosheets and the substrate.

15. The method of claim 14, wherein the central vertical pillar is a sacrificial pillar, further comprising:
   restoring the pillar trench by selectively etching the sacrificial pillar;
   forming a partial vertical gap between the stack of nanosheets and the substrate by selectively etching the remnants of the semiconductor layer of the third composition from the pillar trench, wherein the dielectric liner supports the stack of nanosheets above the substrate; and
   forming a final vertical pillar and a central portion of the bottom dielectric insulator by depositing a dielectric material into the partial vertical gap and the pillar trench.

16. The method of claim 8, wherein the central vertical pillar is a sacrificial pillar, further comprising:
   depositing a dielectric liner over the substrate and the stack of nanosheets;
   restoring the pillar trench by selectively etching the sacrificial pillar; and
   forming a vertical gap between the stack of nanosheets and the substrate by selectively etching the semiconductor layer of the third composition from the pillar trench, wherein the dielectric liner supports the stack of nanosheets above the substrate.

17. The method of claim 13, further comprising forming a final vertical pillar and a bottom dielectric insulator by depositing a dielectric material into the vertical gap and the pillar trench.

18. The method of claim 8, further comprising:
   etching the central vertical pillar partially into the pillar trench, but above an uppermost sheet of the stack of nanosheets.

19. The method of claim 18, further comprising:
   removing the left and right etch masks, the spacers, and the hard mask.

20. The method of claim 19, further comprising:
   forming a plurality of vertical gaps between the plurality of semiconductor layers of the first composition by selectively etching the plurality of semiconductor layers of the second composition; and
   depositing a gate stack composed of at least one dielectric layer and one conductive layer into the plurality of vertical gaps.

* * * * *